(12) United States Patent
Vollmerhausen

(10) Patent No.: US 12,074,595 B2
(45) Date of Patent: Aug. 27, 2024

(54) FOCAL PLANE ARRAYS USING AN ORTHOGONAL CODE READOUT

(71) Applicant: Richard H. Vollmerhausen, Lake Mary, FL (US)

(72) Inventor: Richard H. Vollmerhausen, Lake Mary, FL (US)

(73) Assignee: Richard H. Vollmerhausen, Lake Mary, FL (US)

( * ) Notice: Subject to any disclaimer, the term of this patent is extended or adjusted under 35 U.S.C. 154(b) by 269 days.

(21) Appl. No.: 17/679,047

(22) Filed: Feb. 23, 2022

(65) Prior Publication Data

US 2023/0268921 A1  Aug. 24, 2023

(51) Int. Cl.
 *H03K 17/968* (2006.01)
 *H04B 10/69* (2013.01)

(52) U.S. Cl.
 CPC ........... *H03K 17/968* (2013.01); *H04B 10/69* (2013.01)

(58) Field of Classification Search
 None
 See application file for complete search history.

(56) References Cited

U.S. PATENT DOCUMENTS

| | | | |
|---|---|---|---|
| 5,262,871 A * | 11/1993 | Wilder | H04N 25/76 348/E3.018 |
| 6,310,571 B1 | 10/2001 | Bidermann | |
| 6,541,751 B1 | 4/2003 | Bidermann | |

* cited by examiner

*Primary Examiner* — Tony Ko
(74) *Attorney, Agent, or Firm* — John L. DeAngelis; Wolter, Van Dyke, Davis, PLLC

(57) ABSTRACT

This Orthogonal Code Readout (OCR) electronically expands the dynamic range of CMOS active pixels by adding digital electron wells. The dynamic range of an active pixel is not limited by in-pixel capacitance. When employed as a thermal array readout, OCR simplifies thermal detector array fabrication by eliminating the need for large electron well capacitors. OCR also improves digital quantization beyond that provided by hardware digitizers.

10 Claims, 4 Drawing Sheets

FOCAL PLANE ARRAYS USING AN ORTHOGONAL CODE READOUT

FIELD OF THE DISCLOSURE

This disclosure describes a camera focal plane array (FPA) readout.

The invention is applicable to both linear and two dimensional detector arrays.

The invention is applicable to both photo voltaic and photo conductive detectors.

The invention expands the dynamic range of photo voltaic FPA by electronically enlarging their electron wells.

The invention provides a mechanism to continually and rapidly sense the current of photo conductive FPA without requiring high analog to digital conversion rates.

The invention simplifies the fabrication of thermal focal plane arrays (FPA).

OBJECT OF THE INVENTION

The Orthogonal Code Readout (OCR) enhances imaging performance by implementing an image array readout with global shutter that does not saturate and provides large dynamic image imagery.

Exposure times are not limited by FPA electron well capacity or scene brightness.

BACKGROUND OF THE INVENTION

Patent U.S. Pat. No. 6,310,571 B1 dated Oct. 30, 2001 by Bidermann, "Multiplexed Multi-Channel Bit Serial Analog to Digital Converter," discloses a circuit to sequentially select a single photo site for analog to digital conversion. In Bidermann unlike in the present disclosure, multiple pixels are not selected simultaneously using orthogonal codes or other mechanisms. The benefits of digitizing multiple pixel reads simultaneously are not implemented or discussed in Bidermann.

Patent U.S. Pat. No. 6,541,751 B1 dated Apr. 1, 2003 by Bidermann, "Time Multiplexing Image Processing Functions for Noise Reduction," proposes a system (imager with processor) on a single chip. The noise reduction is needed because typical noise rejection techniques do not work with the imager and processor on the same silicon. Bidermann proposes a method for turning off noise sources during analog to digital conversion. Bidermann does not propose multiplexing pixel readouts.

One of many techniques known to CMOS designers is called "Multiplexed Active Pixel Sensor." In this case, "multiplex" refers to sharing transistors between pixels in order to reduce wafer fabrication cost.

Prior art CMOS imagers store photo charge on the intrinsic detector capacitance or on a separate capacitor that shares the pixel area. Either implementation limits the amount of charge that can be stored.

The prior art electron wells are deep enough to provide good imagery for high contrast scenes, but the wells are not deep enough for restoration of contrast lost due to glare, motion, and other factors that reduce image modulation. Also, wide dynamic range scenes containing sun and shadow require deeper wells to render the details in both the bright and the dark areas of the scene.

DESCRIPTION CODES USED

In the present invention, implementation is explained and illustrated using Walsh-Hadamard Codes. Included in those codes set are Pseudo Noise Codes (PNC) and Hadamard Codes (HC) or Hadamard Matrices. PNC and HC provide the needed algorithmic behaviour, where using the codes is not computationally intensive, and the codes consist of zeros and ones or ones and negative ones.

The algorithmic behaviour needed is orthogonality of the code set. That is, each member of a code set correlates with itself, but cross-correlations between different codes in the set results in either zero (orthogonality) or a constant other than zero (bi-orthogonality).

There are more image-suitable code lengths available with HC than PNC. Example HC code lengths are any integer n where n, n/12, or n/20 is a power of 2.

PNCs are maximum length shift register sequences and are easy to generate. Further, unlike HCs, each PNC is a shift of the previous code, and that can simplify software or hardware implementation.

PNCs code lengths exist for integers $2^n-1$ where n is an integer from 2 to at least 23 except for 8. It is highly likely that codes exist for n larger than 23.

Critical to the present invention is that HC can be arranged to minimize image artefacts generated when there is motion in the scene or motion between camera and scene.

Codes other than Walsh-Hadamard PNC and HC can be used, as long as the code set is at least approximately orthogonal or bi-orthogonal and a way can be found to minimize the effects of scene motion.

The code set used to implement the present invention need not consist solely of −1, 0, and 1. If, for example, codes consist of integers 1 through 4, then a 1 code value is held (sampled) for ¼$^{th}$ the time of a 4 code value. Although the codes used in the present invention consist only of −1 and 1 or 0 and 1, any orthogonal code set is suitable for invention implementation.

One example of an alternative code set is sine waves, that is, a set of sines and cosines that make up a discrete Fourier code set.

DESCRIPTION OF THE PREFERRED EMBODIMENT

Figure 1:
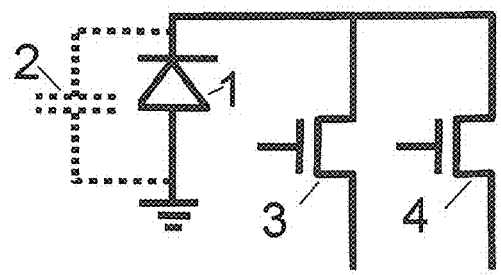
FIG. 1 shows the architecture of a simple Complementary Metal Oxide Semiconductor (CMOS) passive pixel.

A more complete understanding of these embodiments, and the attendant advantages and features thereof, will be more readily understood by reference to the following detailed description when considered in conjunction with the accompanying drawings. The drawings described herein are shown only for illustrative purposes. Not all possible configurations are included and the embodiments shown are not intended to limit the scope of the present invention.

The present invention has the potential to be configured in multiple versions so as to generate superior technical performance in any given application. Therefore, it is understood that in some configurations not all elements will always be necessary for the specific embodiment or implementation of the invention. It should also be apparent that there is no restrictive one-to-one correspondence between any given embodiment of the invention and the elements in the drawing.

For clarity and in order to emphasize certain features, all of the invention features are not shown in the drawing, and all of the features that might be included in the drawing are not necessary for every specific embodiment of the present invention. The present invention also encompasses embodiments that combine features illustrated in the drawing; embodiments that omit, modify, or replace some of the features depicted; and embodiments that include features not illustrated in the drawing.

As used herein, relational terms, such as "first" and "second," "top" and "bottom," and the like, may be used solely to distinguish one entity or element from another entity or element without necessarily requiring or implying any physical or logical relationship or order between such entities or elements.

The drawing is integral to the application and is included to illustrate the present invention.

Embodiments of the present invention will be described more fully hereinafter with reference to the accompanying drawings in which like numerals and numerals appended with letters represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Any reference to "invention" or the specific invention name "orthogonal multiplexing" within this document is a reference to an embodiment of a family of inventions, with no single embodiment including features that are necessarily included in all embodiments, unless otherwise stated. Furthermore, although there may be references to "advantages" provided by some embodiments, other embodiments may not include those same advantages, or may include different advantages. Any advantages described herein are not to be construed as limiting to any of the claims.

Specific quantities, dimensions, spatial characteristics, compositional characteristics and performance characteristics may be used explicitly or implicitly herein, but such specific quantities are presented as examples only and are approximate values unless otherwise indicated. Discussions and depictions pertaining to these, if present, are presented as examples only and do not limit the applicability of other characteristics, unless otherwise indicated.

In describing preferred and alternate embodiments of the invention, specific terminology is employed for the sake of clarity. The technology described herein, however, is not intended to be limited to the specific terminology so selected, and it is to be understood that each specific element includes all technical equivalents that operate in a similar manner to accomplish similar functions.

The drawings use a combination of electrical symbols, logic symbols and pictorial representations to illustrate the elements of the invention. In the interest of clarity, the symbols are simplified and do not explicitly show unneeded detail.

Example embodiments will now be described more fully with reference to the accompanying drawings of the invention. Specific details are set forth such as examples of specific components and methods to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known device structures are not described in detail.

The invention has the potential to be configured in multiple versions so as to generate superior technical performance in any given application. Therefore, it is understood that in some configurations not all elements will always be necessary for the specific embodiment or implementation of the invention. It should also be apparent that there is no restrictive one-to-one correspondence between any given embodiment of the invention and the elements in the drawing.

DETAILED DESCRIPTION OF THE PREFERRED EMBODIMENT

The preferred embodiment operates upon photo voltaic detectors (that is, photo diodes). The detectors either have sufficient stray capacitance to store a useful number of electrons, or a capacitor is added in parallel to the photo detector. The in-pixel capacitance is necessary but its size does not limit dynamic range when OCR is implemented.

The preferred embodiment also assumes OCR implementation in CMOS, since CMOS is currently the most widely used imaging technology. OCR applies to other imaging technologies. Further, an OCR can act as read out integrated circuit (ROIC) for any spectral band detector array. OCR can also act as ROIC for photo conductive detector arrays.

Orthogonal encoding theory assumes a temporally static data input. Since the current invention applies orthogonal codes for FPA readout, theory requires a static scene. The current invention adapts coding implementation to accommodate scene movement. Another aspect that must be accommodated by the invention, is that noise introduces a temporal component to the OCR data. OCR can replace in-pixel photo electron storage, but OCR works best by extending (enlarging) the pixel electron well rather than replacing it.

FIG. 1 illustrates the logic of operation of a CMOS passive pixel. The photo detector 1 has a stray capacitance 2 that stores photo electrons. Additional capacitance can optionally be added to each pixel to increase electron storage. The pixel incorporates two field effect transistors (FET) 3 and 4. One FET dumps all of the photo charge onto an add bus, the other FET dumps all the photo charge onto a subtract bus.

Figure 2:
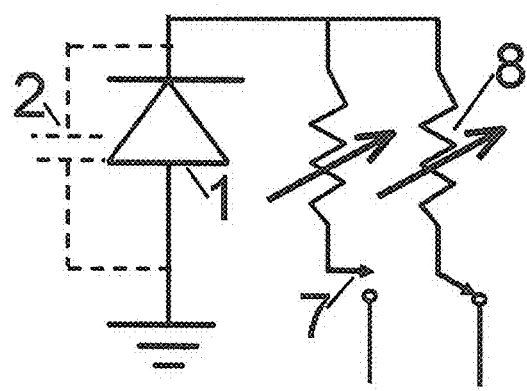
FIG. 2 illustrates the circuit logic used to provide temporal frequency low pass filtering of the FIG. 1 photo signal.

FIG. 2 illustrates how to adapt the FIG. 1 pixel for better performing OCR implementation. Each FET 3 and 4 in FIG. 1 can act as a switch 7 in FIG. 2 (circuit on or off) or as a variable resistor 8 by changing gate voltage. A low pass filter is created by the detector capacitance and FET resistance. Since the detector capacitance is small, gate duty cycle (that is, toggling switch 7) can be used in combination with gate voltage to effectively control average FET resistance.

Figure 3:
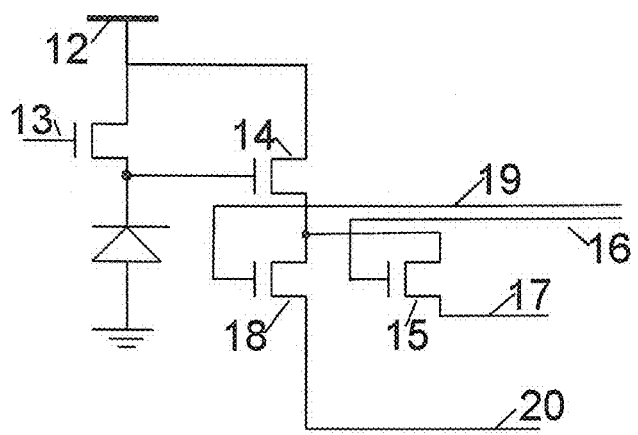
FIG. 3 shows the architecture of an active CMOS pixel.

FIG. 3 shows an active CMOS pixel with better low light performance than the FIGS. 1 and 2 configurations. In FIG.

3, 12 is a bias voltage and 13 pixel reset. FET 14 is a source follower. Items 15, 16, and 17 are respectively the FET, gate control, and output signal for an OCR add. Items 18, 19, and 20 are respectively the FET, gate control, and output signal for an OCR subtract.

FIGS. 2 and 3 illustrate the types of pixel configurations that best interface to an OCR. OCR expands dynamic range by taking a sequence of temporal samples that complete the signal integrations begun in each pixel. OCR essentially makes the capacitor storage in each pixel bigger. OCR works best when the pixel temporally pre-filters the OCR samples.

The FIG. 2 pixel produces very little current flow, but OCR sums the current from many pixels before taking a sample. The detector fill factor of the passive FIG. 2 pixel is larger than active pixel fill factors, so the potential exists that the simpler passive pixel might compete in terms of low light performance.

Figure 4:
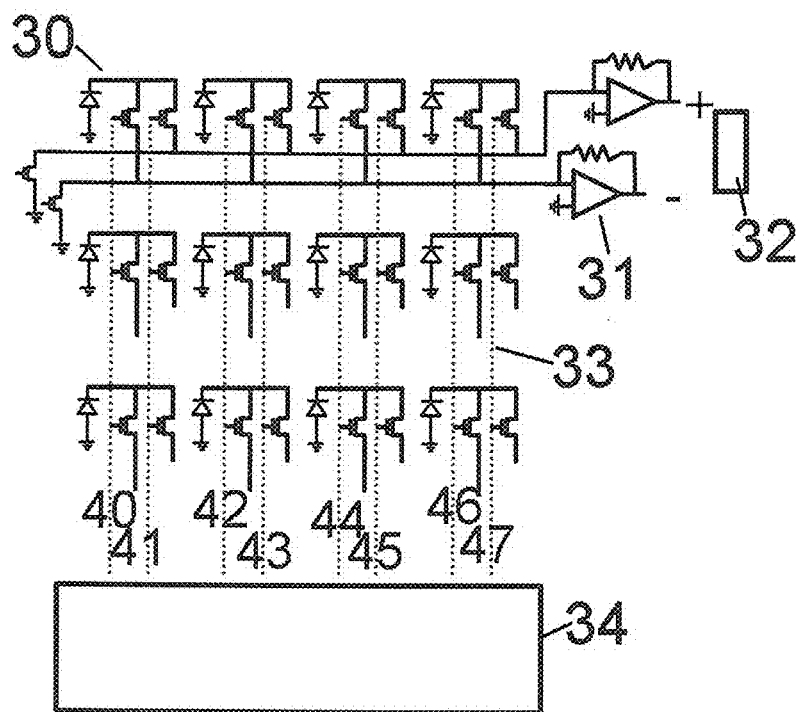
FIG. 4 illustrates the implementation of the present invention using a three row by four column image array and the pixel shown in FIG. 2.

FIG. 4 shows twelve FIG. 2 pixels 30 arranged in a 4 by 3 image array. In this example, all four pixels in each of the three rows are treated alike, so only the processing for a single row of four pixels is described in detail.

The amplifiers 31 in FIG. 4 provide the virtual ground needed for proper operation of the pixel 30. OCR sampling occurs when switches 7 in FIG. 2 are closed and connect current to amplifiers 31. Control of FET switching and resistance is provided by control logic 34 through control line 33. Digitizer 32 converts the analog OCR samples to digital values for interface to a digital processor not shown in the figure. Control lines 40, 42, 44, and 46 select pixel subtracts, and control lines 41, 43, 45, and 47 select pixel adds.

The encoding process works as follows. Four signals $P_A$, $P_B$, $P_C$, and $P_D$ from pixels A, B, C, and D are encoded using a four element HC to yield four sample values $S_A$, $S_B$, $S_C$, and $S_D$.

$$[S_A S_B S_C S_D] = [P_A P_B P_C P_D] * \begin{bmatrix} 1 & 1 & 1 & 1 \\ 1 & -1 & 1 & -1 \\ 1 & 1 & -1 & -1 \\ 1 & -1 & -1 & 1 \end{bmatrix} \quad (1)$$

$$[S_A S_B S_C S_D] = [(P_A + P_B + P_C + P_D)$$
$$(P_A - P_B + P_C - P_D)(P_A + P_B - P_C - P_D)(P_A - P_B - P_C + P_D)]$$

where (·) indicates matrix multiply. To retrieve pixel intensity values $P_A$, $P_B$, $P_C$, and $P_D$ $$[S_A S_B S_C S_D] = [S_A S_B S_C S_D] * \begin{bmatrix} 1 & 1 & 1 & 1 \\ 1 & -1 & 1 & -1 \\ 1 & 1 & -1 & -1 \\ 1 & -1 & -1 & 1 \end{bmatrix}. \quad (2)$$

If the number of pixels in a row is NN, then NN pixels are summed for each sample and NN samples are taken over the exposure period. Pixel values Pixel(1:NN) are retrieved by the summation shown in Eq. 3.

$$\text{Pixel}(1: NN) = \sum_m \text{Sample}(m) H(m, 1: NN) \quad 3$$

where H(m,1:NN) represents the $m^{th}$ row of the Hadamard matrix.

Figure 5:
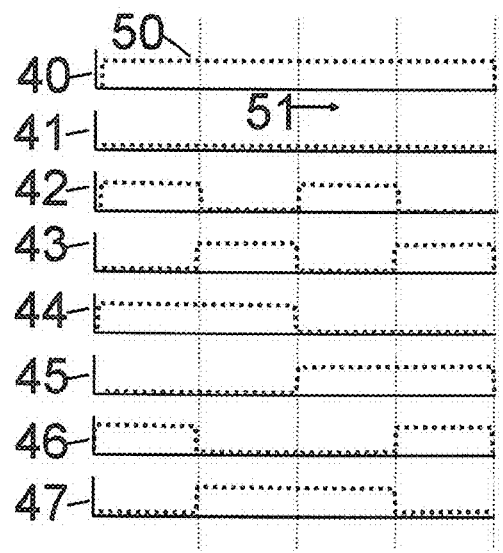
FIG. 5 shows the control timing to read out the FIG. 4 detector array.

FIG. 5 shows plots 50 of gate on (high) and gate off (low) versus time SI for each control line 40 through 47. Each plot represents either the +1 state of the four element HC or the −1 state. Sums and differences are taken based on the selected HC, the sums digitized, and the pixel amplitudes recovered in a digital processor.

Figure 6:
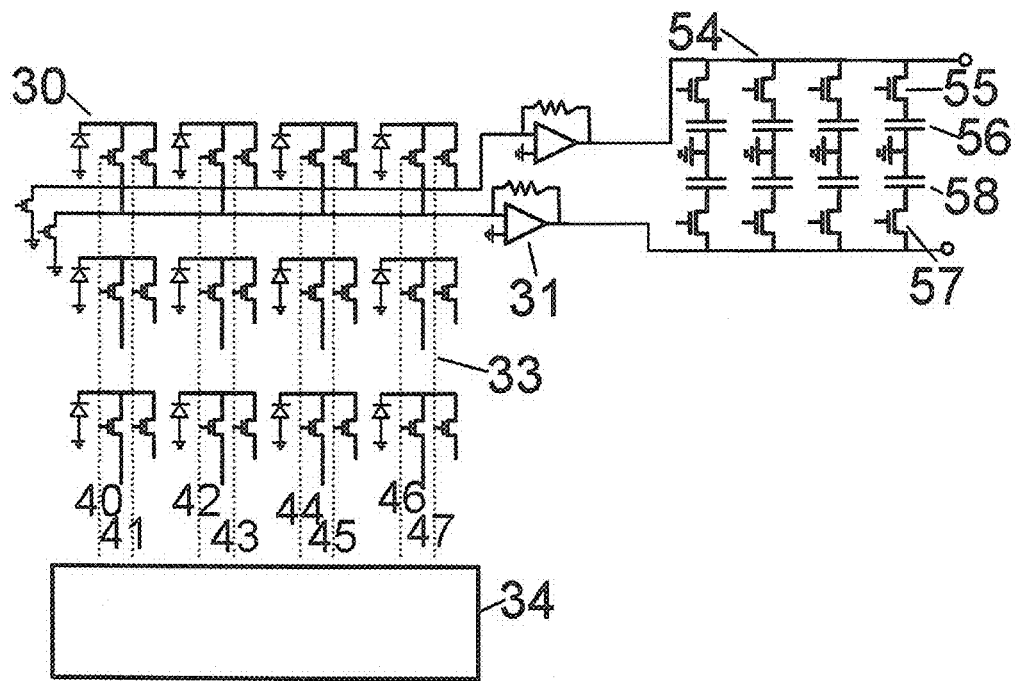
FIG. 6 illustrates adding an array of capacitors to the implementation shown in FIG. 4 in order to minimize rate demand on the digitizers.

When using any pixel architecture like FIG. 1, 2, or 3, the OCR encoding process must be completed within an exposure time. In order to accomplish that, the analog to digital conversion (ADC) rate of is quite high. One option to reduce the ADC rate is to add a sample and hold array 54 as illustrated at upper right in FIG. 6. One storage area consisting of two FET 55 and 57 and two capacitors 56 and 58 is required for every pixel in the row.

Figure 7:
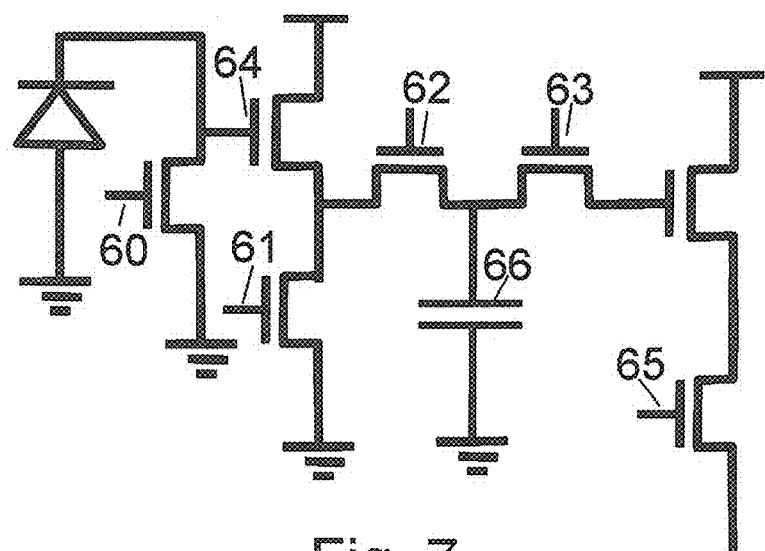
FIG. 7 shows an active CMOS pixel architecture with in-pixel added capacitor for temporary storage.

Another option that increases the time available for data digitization is to use an active CMOS pixel like that shown in FIG. 7. In FIG. 7, FET 60 through 65 are reset, bias voltage, transfer, read, source follower, and pixel select respectively. Item 64 is a storage capacitor.

The OCR coding operation is the same as for passive pixels. However, the active pixel is reset after some number (N) of OCR samples. If (n) is the count from 1 to N, and if P sample trains are taken such that N multiplied by P equals the Hadamard Code length, then the sample amplitudes are normalized by dividing by the count from last reset (n). The normalization by (n) can be applied in the digital processor rather than in hardware.

Normalization of the code samples is necessary because active pixels like that in FIG. 7 integrate photo electrons whereas OCR expects a current measurement that is constant over time. Precise normalization is not critical, but un-normalized samples create lines offset from bright edges in the image. Other than normalizing the samples, OCR sampling and image processing remain the same as previously described.

OCR samples are taken during exposure. Once exposure time has elapsed, the transfer gate 62 in FIG. 7 is opened, but OCR sampling continues until code completion. Once the transfer gate is opened, the divide by (n) normalization stops, but the relative contribution of samples taken with the transfer gate in a different state must be assessed and the code correctly normalized. Again, however, the sample normalization requires attention but not great precision. Also, the sample normalization is done digitally.

The preferred embodiment example OCR uses a four element Hadamard matrix in order to simplify the description. In practice, all pixels in a row or column or area of hundreds or thousands of pixels can be encoded and decoded. Codes exist to encode entire images if that is desired. On the other hand, a single row or column can be encoded by applying 16, 32, or 64 element codes many times.

A serious problem with implementing orthogonal encoding has not yet been mentioned and must be dealt with. Namely, if certain steps are not taken to refine the Hadamard Code, Hadamard encoding might result in poor imaging when the scene or objects in the scene move relative to the camera line of sight.

Figure 8:
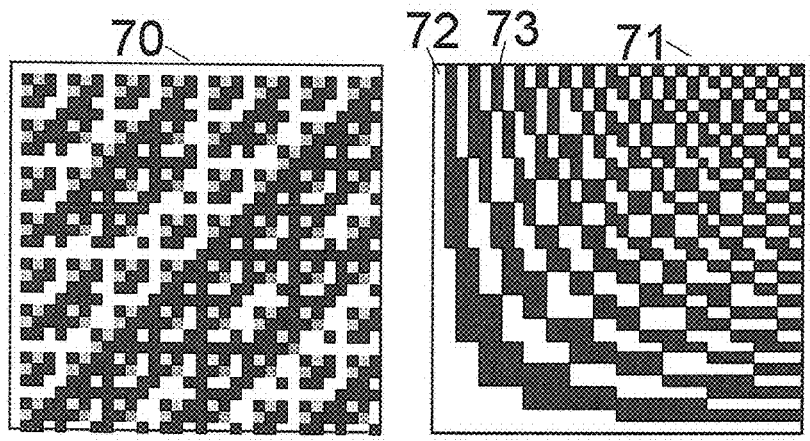
FIG. 8 illustrates a Hadamard pattern in normal row order and in sequency row order.

FIG. 8 shows a 32 element HC displayed twice with the rows in different orders. The matrix is illustrated by showing a picture where ones 72 are represented by white squares and minus ones 73 by black squares. Note that the orthogonality of the HC does not depend on row order. Each row is orthogonal to the other rows, and that does not change when rows are moved up or down. When applying the codes for imaging, each row in order from top to bottom is used to establish which pixels in the row are added and which are subtracted. The time order of how the imagery is sampled does affect imaging.

The matrix illustrated by 70 in FIG. 8 is in normal order; The 70 arrangement is what is typically called a Hadamard matrix. The row arrangement shown by 71 is in descending sequency order. Sequency is the number of times the amplitude changes from minus one to one or from one to minus one in a row. The 71 matrix is derived from the 70 matrix by placing the rows in 71 in descending sequency order. The following discussion holds also for ascending sequency order, that is, the matrix 1 can be flipped vertically.

Figure 9:
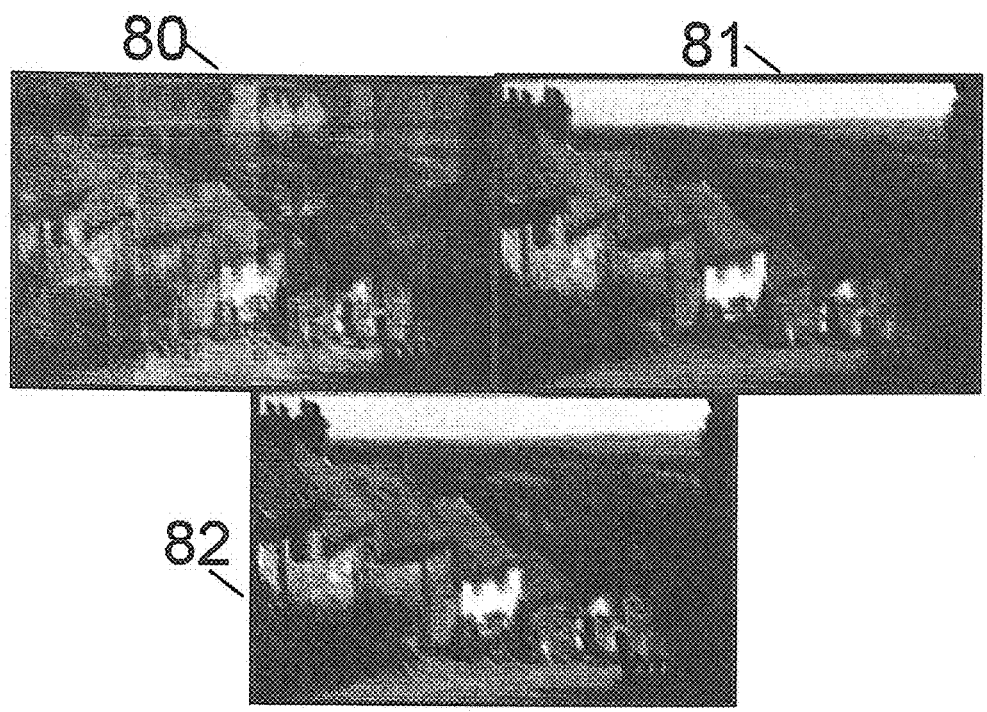
FIG. 9 shows the effect of sequency order on imaging motion.

The picture in FIG. 9 are 512 pixels wide and 385 pixels high. Motion in the FIG. 9 pictures is 16 pixels both horizontally and vertically during image capture. The problems with non-sequenced Hadamard coding are quite obvious in the 80 picture in FIG. 8. The sequenced Hadamard picture 81 is virtually identical to the typical motion blur picture 82. Motion artefacts are avoided by sequencing the Hadamard Code.

What is claimed is:

1. An array of photo detectors with stray capacitance to store electrons having a means of summing and differencing photo detector signals from some, many, or all of the photo detectors in the array, wherein:
    a. the photo detector signals from several, many, or all of the photo detectors are summed and differenced based on orthogonal codes;
    b. the summed photo detector signals are sampled and sample values are digitized and stores;
    c. pixel sums are sampled continually at a regular rate to collect pixel samples equal to a number of pixels summed; and
    d. pixel intensities are recovered in a digital processor by using the pixel samples together with the properties of the orthogonal codes used to control sampling.

2. The implementation of claim 1 where the array of photo detectors is sensed passively by using two FET to dump a charge to a plus or minus side of a differential sample and hold.

3. The implementation of claim 2 where a gate voltage and on-duty-cycle of the two FET are used to create a low pass filter for each of the photo detectors.

4. The implementation of claim 1 where a source follower FET or FETs is used to buffer the photo detector signals prior to sampling.

5. The implementation of claim 4 where an active pixel with capacitive storage is added to each of the photo detectors.

6. The implementation of claim 5 where photo detector signals samples are normalized by dividing by a count from a last reset.

7. The implementation of claim 1 where photo detector sums and differences are based on Walsh-Hadamard Codes.

8. The implementation of claim 7 where the Walsh-Hadamard Code used for determining the photo detector sums and differences are arranged in sequence row order.

9. The implementation of claim 1 adding a bank of sample and hold capacitors to store sample values.

10. The implementations of claim 1 adding a capacitor connected in parallel through transfer FETs with the photo detectors to provide a storage mechanism that lengthens the time available for digitizing pixel data.

* * * * *